United States Patent
Schelling et al.

(10) Patent No.: US 10,607,888 B2
(45) Date of Patent: Mar. 31, 2020

(54) METHOD FOR PRODUCING A CONDUCTIVE THROUGH-PLATING FOR A SUBSTRATE AS WELL AS CONDUCTIVE THROUGH-PLATING

(71) Applicant: Robert Bosch GmbH, Stuttgart (DE)

(72) Inventors: Christoph Schelling, Stuttgart (DE); Johannes Classen, Reutlingen (DE); Simon Genter, Karlsruhe (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/475,755

(22) PCT Filed: Apr. 6, 2018

(86) PCT No.: PCT/EP2018/058818
§ 371 (c)(1),
(2) Date: Jul. 3, 2019

(87) PCT Pub. No.: WO2018/185262
PCT Pub. Date: Oct. 11, 2018

(65) Prior Publication Data
US 2019/0371665 A1    Dec. 5, 2019

(30) Foreign Application Priority Data
Apr. 7, 2017 (DE) .................. 10 2017 205 964

(51) Int. Cl.
*H01L 21/768* (2006.01)
*H01L 23/48* (2006.01)
*H01L 23/00* (2006.01)

(52) U.S. Cl.
CPC .... *H01L 21/76898* (2013.01); *H01L 21/7682* (2013.01); *H01L 21/76802* (2013.01);
(Continued)

(58) Field of Classification Search
CPC .......... H01L 21/76898; H01L 21/7682; H01L 23/481
See application file for complete search history.

(56) References Cited

U.S. PATENT DOCUMENTS 9,035,432 B2 * 5/2015 Reinmuth ............ H01L 23/481
257/621

FOREIGN PATENT DOCUMENTS

| DE | 102009027321 A1 | 1/2011 |
| DE | 102012210033 A1 | 12/2013 |
| EP | 2408006 A2 | 1/2012 |

OTHER PUBLICATIONS

International Search Report dated Jul. 5, 2018 of the corresponding International Application PCT/EP2018/058818 filed Apr. 6, 2018.

* cited by examiner

*Primary Examiner* — Jose R Diaz
(74) *Attorney, Agent, or Firm* — Norton Rose Fulbright US LLP; Gerard Messina

(57) ABSTRACT

A conductive through-plating for a substrate includes a metal component, a first conductive structure situated on or in the environment of a surface of the substrate, and a second conductive structure situated on or in the environment of a further surface of the substrate. A method for producing the through-plating includes, in a first step, at least partially applying above the surface a grid structure that includes a group of openings; in a second step following the first step, carrying out an etching producing a trench in the substrate and at least partially also underneath the group of openings; and, in a fifth step following the second step, carrying out a metallization situating a metal component at least partially in the trench such that the metal component is part of a seal sealing the trench in the area of the surface.

16 Claims, 9 Drawing Sheets

(52) U.S. Cl.
CPC ...... *H01L 21/76877* (2013.01); *H01L 23/481* (2013.01); *H01L 24/13* (2013.01)

METHOD FOR PRODUCING A CONDUCTIVE THROUGH-PLATING FOR A SUBSTRATE AS WELL AS CONDUCTIVE THROUGH-PLATING

CROSS-REFERENCE TO RELATED APPLICATIONS

The present application is the national stage of International Pat. App. No. PCT/EP2018/058818 filed Apr. 6, 2018, and claims priority under 35 U.S.C. § 119 to DE 10 2017 205 964.8, filed in the Federal Republic of Germany on Apr. 7, 2017, the content of each of which are incorporated herein by reference in their entireties.

FIELD OF THE INVENTION

The present invention is directed to a conductive through-plating for a substrate and to a method for producing a conductive through-plating for a substrate.

BACKGROUND

Highly integrated semiconductor components and sensor clusters are frequently combined into what are called 'chip-scale packages' (CPS) on small unit sizes. Toward this end, a plurality of chips or substrates with components (such as sensors) are stacked on top of one another. In many cases the contacting of the individual components is accomplished using through-platings such as what is known as 'through silicon vias' (TSV). Through-platings are available in different developments such as in the form of etched trenches packed with metals or as free-standing silicon pillars.

SUMMARY

A disadvantage of etched trenches packed with metals, for example, is that high parasitic capacitances arise and considerable mechanical tensions (mechanical stresses) are created.

A disadvantage in the case of free-standing silicon pillars, for instance, is that a highly doped silicon substrate must be used and/or that the silicon pillar has to be developed with a relatively large cross-sectional area so that the through-plating has sufficient conductivity. In addition, the use of a highly doped substrate is often incompatible with the function of the components and sensors, which are placed on the substrate, or with the semiconductor process (for instance if the substrate is to have infrared transparency).

An object of the present invention is to provide a through-plating for a substrate which has a relatively high conductivity and high robustness with respect to external influences, and which can also be used in the most flexible way possible for different components. According to an example embodiment of the present invention, this objective is achieved by a method for producing a conductive through-plating for a substrate, the through-plating having a metal component, a first conductive structure being situated on or in the environment of a surface of the substrate, and a second conductive structure being situated on or in the environment of a further surface of the substrate, where, in a first step, a grid structure is disposed at least partially above the surface, the grid structure having a group of openings; in a second step that follows the first step, an etching step is carried out, and during the etching step, at least one trench is produced both in the substrate and also at least partially underneath the group of openings; and, in a fifth step that follows the second step, a metallization step is carried out, the metal component being at least partially positioned in the trench during the metallization step, the metal component being developed during the metallization step so that the metal component is part of a seal, the seal sealing the trench in the region of the surface.

The method according to the present invention for producing a conductive through-plating for a substrate and the conductive through-plating for a substrate according to example embodiments of the present invention have an advantage over the related art that a substrate (which is made of silicon or includes silicon, for instance) is able to be used, which has a low (or no) electric conductivity. However, according to the present invention it is also possible to use a substrate that has a relatively high conductivity (e.g., on account of a relatively high doping). In addition, it is advantageously possible that the through-plating is produced using only one etching step. It is furthermore possible that the through-platings according to the present invention have a relatively high conductivity at a relatively small cross-sectional area. According to the present invention, it is possible to develop the through-plating in a cost-effective manner and with high compatibility with different sensors, semiconductor components, micro-electromechanical systems, etc.

Example embodiments and further refinements of the present invention can be gathered from the dependent claims as well as from the description with reference to the drawings.

According to an example embodiment of the present invention, the seal of the trench abuts the surrounding surface of the substrate in a planar/flat manner, so that the substrate has a planar surface in the region and in the environment of the through-plating. This advantageously makes it possible to position the substrate having the through-plating in a stack of substrates (such as a sensor cluster).

Since the group of openings is at least partially free of the dielectric layer during and following the arrangement of the dielectric layer during the third step, the metal component is able to be at least partially situated within the trench during the metallization step according to an example embodiment of the present invention.

Because the grid structure includes a further group of openings, the further group of openings having a similar opening width and opening length as the group of openings, or having a smaller opening width and opening length than the group of openings, at least one further trench being produced in the substrate and at least partially underneath the further group of openings during the etching step in the second step, it is possible according to an example embodiment of the present invention to produce the trench and the further trench in the course of only one etching step, thereby allowing the method according to an example embodiment of the present invention to be carried out in a cost-effective and simple manner.

Since the dielectric layer is at least partially disposed in the trench in the third step, the trench particularly having wall regions and bottom regions, and the dielectric layer particularly being at least partially situated on the wall regions in the third step, the dielectric layer particularly being at least partially situated on the bottom regions, according to an example embodiment of the present invention it is advantageously possible to realize the dielectric layer within the trench as an electrical insulating layer, the metal component thereby being electrically insulated from the rest of the substrate using the dielectric layer (in particular in that the dielectric layer is developed on the entire wall regions within the trench). In an advantageous manner, it is possible to develop the metal component in direct contact on the dielectric layer within the trench.

Because the dielectric layer is at least partially removed from the trench in the fourth step during the further etching step, the dielectric layer particularly being at least partially removed from the bottom regions in the fourth step during the further etching step, according to an example embodiment of the present invention it is advantageously possible to remove the dielectric layer at least partially from the bottom region of the trench. This advantageously allows the metal component to be developed in direct contact with the second conductive structure so that the through-plating advantageously has a low electrical resistance. More specifically, it is thereby possible for the dielectric layer not to be removed from the wall regions of the trench and to arrange the metal component on the dielectric layer on the wall regions of the trench. In this way, the dielectric layer is able to electrically insulate the metal component from the rest of the substrate.

Because the further trench has additional wall regions and additional bottom regions, the further wall regions and the further bottom regions as well as in particular the dielectric layer in the area of the further wall regions and in particular in the area of the further bottom regions remaining free of the metal component, it is possible according to an example embodiment of the present invention to arrange the dielectric layer at least partially inside the further trench. In a preferred manner, the dielectric layer can thereby completely seal or cover the further group of openings during or following the third step. In this way, the metal component is advantageously unable to penetrate the further trench in the fifth step. The further trench can therefore be developed as an electrically insulating and preferably sealed cavity.

Because an etch-stop layer is at least partially situated on the surface of the substrate and/or at least partially on the dielectric layer during the fourth step and prior to the further etching step of the fourth step, the etch-stop layer having a group of etch openings, the group of etch openings being at least partially situated above the second further group of openings, it is possible according to an example embodiment of the present invention, in particular if the group of openings was partially or completely covered or sealed by the dielectric layer in the third step, to arrange an etch-stop layer having a group of etch openings. In this way, openings, in particular the second, further group of openings, are able to be produced (underneath the group of etch openings) in the grid structure (and in the dielectric layer) above the trench in the fourth step. In an advantageous manner, the dielectric layer is thereby able to be at least partially removed from the bottom regions of the trench in the fourth step, and the metal component can at least partially be positioned in the trench in the fifth step.

Since the further trench is at least partially developed in the form of an annular region at least around the trench, the further trench is able to electrically insulate the through-plating from the rest of the substrate according to an example embodiment of the present invention.

According to an example embodiment of the present invention, the metal component is part of an electrical connection between the first conductive structure and the second conductive structure.

According to an example embodiment of the present invention, the dielectric layer is electrically insulating (and dielectric).

According to an example embodiment of the present invention, the dielectric layer is at least partially situated on the surface in the third step.

According to an example embodiment of the present invention, the dielectric layer is at least partially situated on the further wall regions and the further bottom regions in the third step.

According to an example embodiment of the present invention, the application of the dielectric layer in the third step is carried out using a non-conformal deposition technology.

According to an example embodiment of the present invention, the metallization step in the fifth step is carried out using a conformal deposition technique, in particular a chemical vapor-phase deposition, the metal component in particular encompassing a tungsten component.

According to an example embodiment of the present invention, during the metallization step the metal component is developed in such a way that the metal component is part of a seal, the seal sealing the trench in the region of the surface.

According to an example embodiment of the present invention, the etch-stop layer includes silicon carbide, silicon carbon nitride or a nitride rich in silicon.

DETAILED DESCRIPTION

Figure 1:
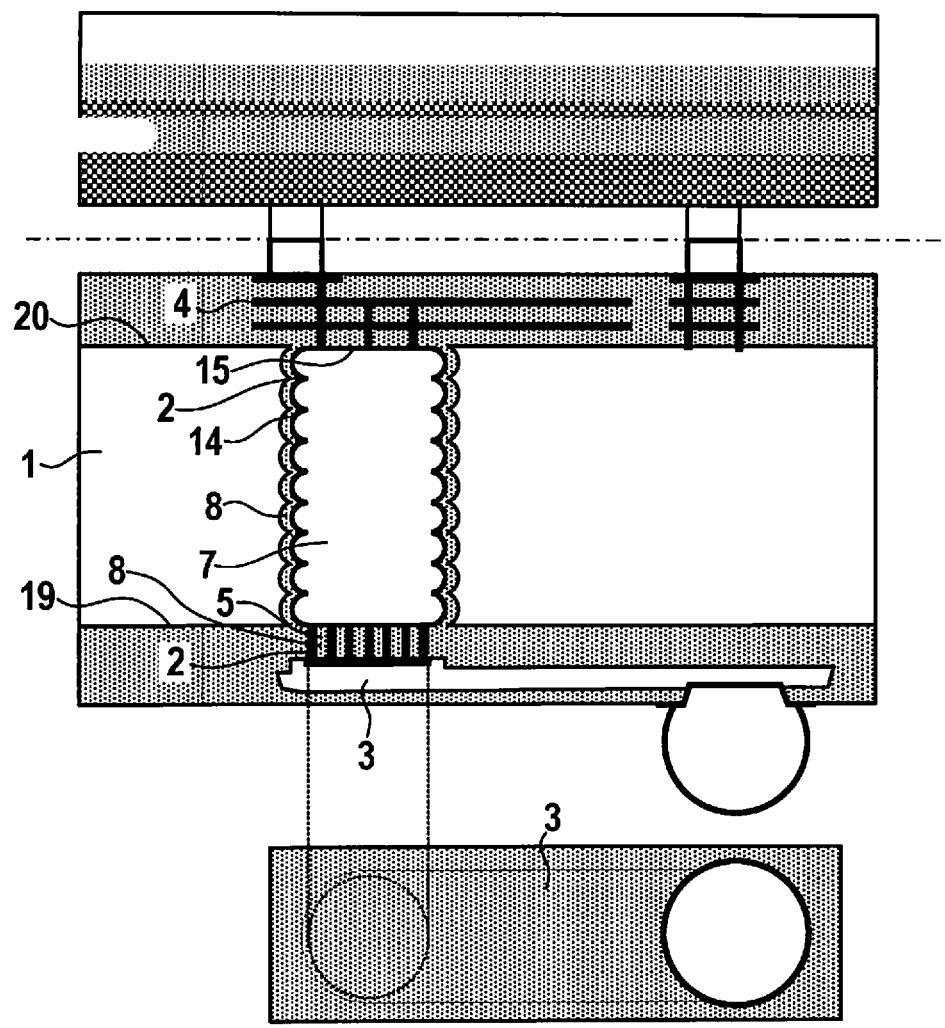
FIG. 1 schematically shows a conductive through-plating through a substrate according to an example embodiment of the present invention.

FIG. 1 schematically illustrates a conductive through-plating through a substrate 1 according to an example embodiment of the present invention. A trench 7 is situated in a substrate 1 so that trench 7 extends from surface 19 (or from the environment of surface 19) to a further surface 20 (or to the environment of further surface 20). A first conductive structure 3 is developed on surface 19 of substrate 1 (or in the environment of surface 19 of substrate 1). A second conductive structure 4 is developed on further surface 20 of substrate 1 (or in the environment of further surface 20 of substrate 1). Trench 7 includes wall regions 14 and bottom regions 15, bottom regions 15 in particular being disposed in the environment of further surface 20, and wall regions 14 representing the boundary of the trench with respect to surrounding substrate 1. An (in particular electrically insulating) dielectric layer 8 is situated on wall regions 14. In contrast, at least portions of bottom regions 15 are free of dielectric layer 8. A metal component 2 is situated (or is at least partially situated) in trench 7, in the area of wall regions 14 on dielectric layer 8 and on bottom regions 15. The metal component electrically links first conductive structure 3 and second conductive structure 4 to each other. A grid structure 5 is situated above trench 7 (in the environment of topside 19), and dielectric layer 8 is particularly at least partially developed on grid structure 5. In this context, it is preferred that dielectric layer 8 and grid structure 5 include identical material components. Above trench 7, openings (in particular a group of openings 6 and/or a second, further group of openings 11) are provided in dielectric layer 8 and in grid structure 5. The openings (i.e., in particular the group of openings 6 and/or the second, further group of openings 11) are packed at least with metal component 2 so that trench 7 is sealed or covered in the region of surface 19 at least through an interaction of metal component 2, grid structure 5, and potentially dielectric layer 8. This provides a sealed cavity in the interior of trench 7.

Figure 2:
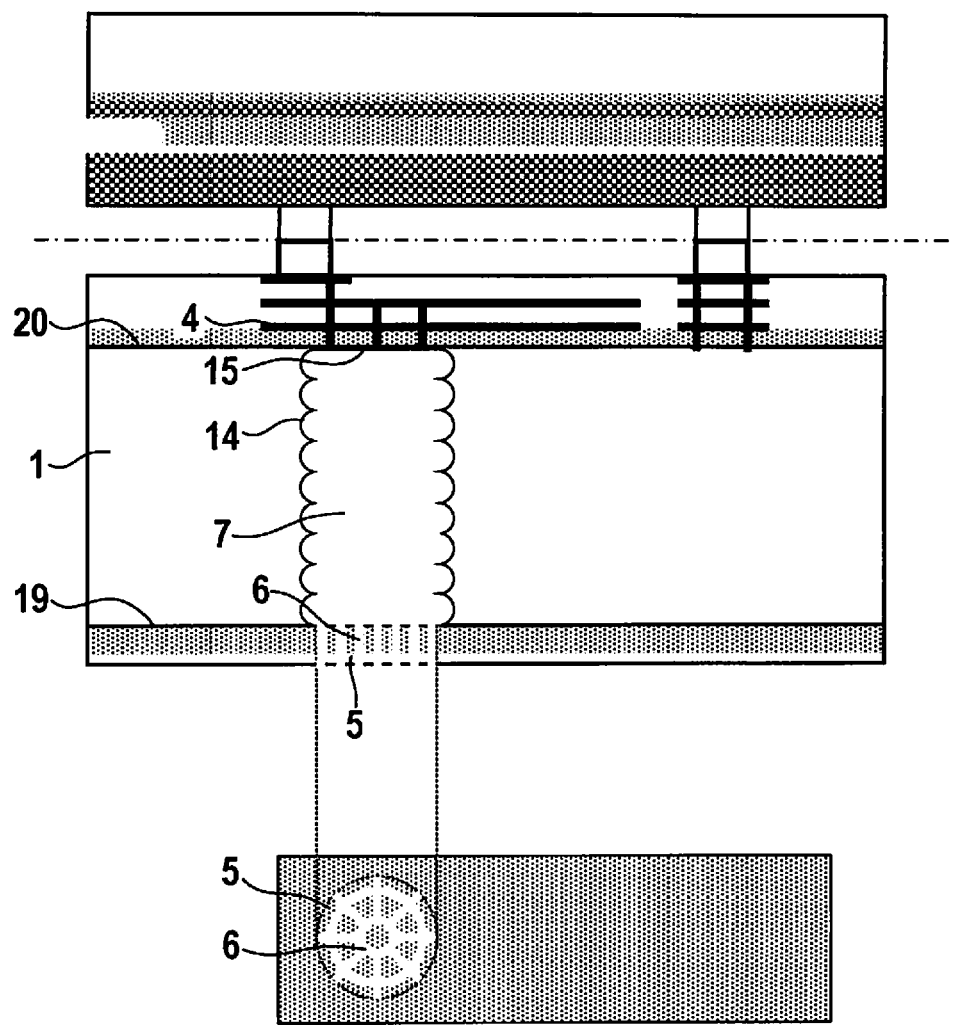
FIG. 2 schematically shows an example embodiment of the present invention following a second step.

FIG. 2 schematically shows an example embodiment of the present invention following a second step. After a grid structure 5 has been produced in a layer disposed on surface 19 in a first step, a trench 7 is created in a substrate 1 in a second step, so that trench 7 extends from surface 19 (or from the environment of surface 19) to a further surface 20 (or to the environment of further surface 20). A second conductive structure 4 is developed on further surface 20 of substrate 1 (or in the environment of further surface 20 of substrate 1). Trench 7 has wall regions 14 and bottom regions 15, bottom regions 15 particularly being situated in the environment of further surface 20 and wall regions 14 representing the boundary of the trench with respect to surrounding substrate 1. A grid structure 5 is disposed above trench 7 (in the environment of topside 19). A group of openings 6 is provided in grid structure 5. Group of openings 6 is at least partially situated above trench 7.

Figure 3:
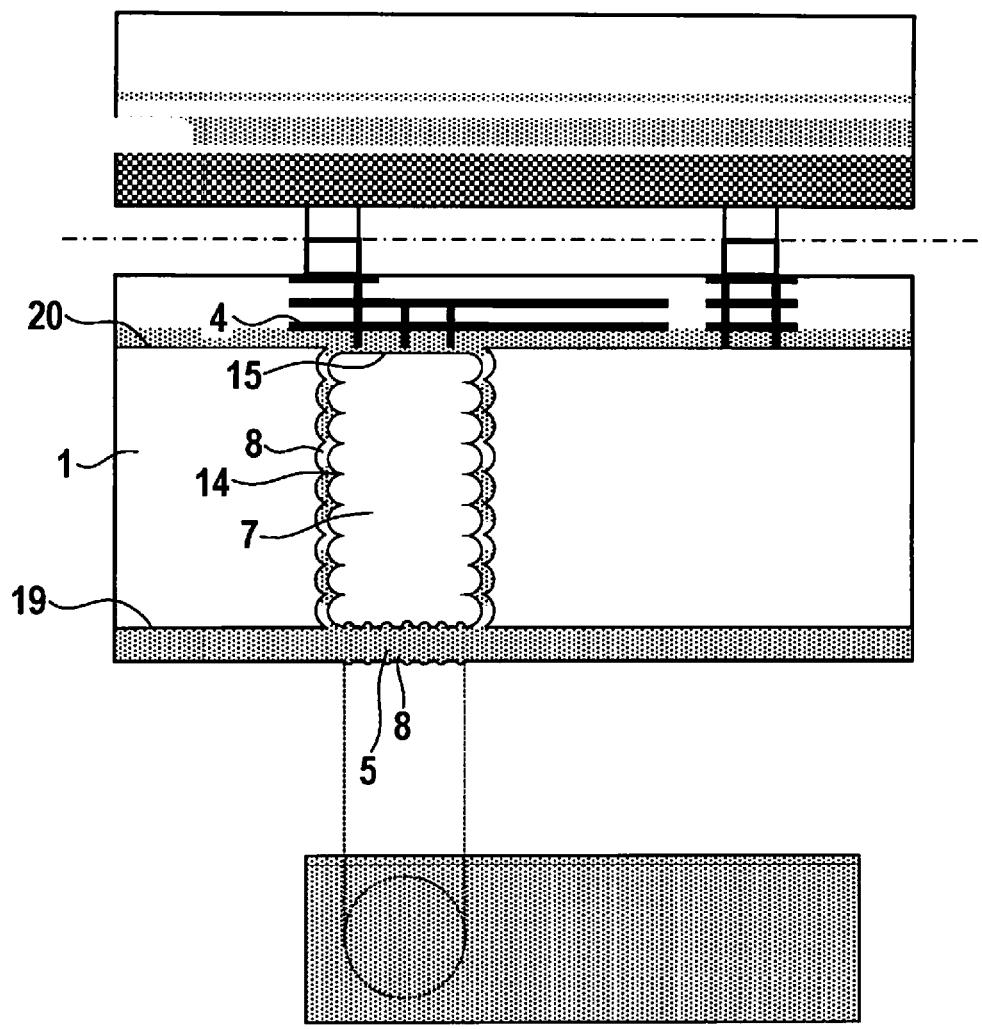
FIG. 3 schematically shows an example embodiment of the present invention following a third step.

FIG. 3 schematically illustrates an example embodiment of the present invention following a third step. In the third step, which follows the second step, a dielectric layer 8 is at least partially applied on grid structure 5. In the example embodiment shown in FIG. 3, dielectric layer 8 is additionally also applied on wall region 14 and bottom regions 15. That is to say, the complete boundary surface (or wall regions 14) between substrate 1 and trench 7 is preferably covered by dielectric layer 8. In addition, in the illustrated example embodiment, the group of openings 6 is covered by dielectric layer 8 so that grid structure 5 and dielectric layer 8 completely cover the trench in the region of topside 19. Dielectric layer 8 has electrically insulating properties.

Figure 4:
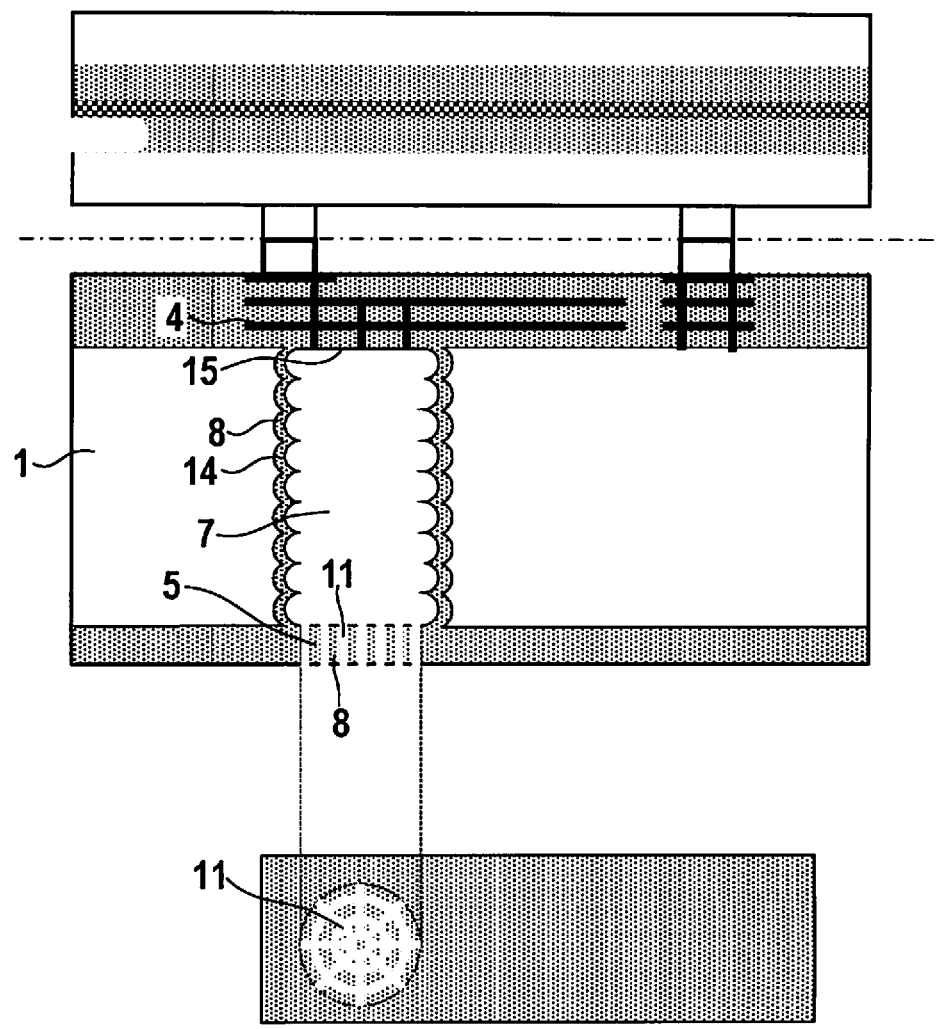
FIG. 4 schematically shows an example embodiment of the present invention following a fourth step.

FIG. 4 schematically shows an example embodiment of the present invention following a fourth step. In the fourth step, a further etching step is carried out. Using a mask and/or an etch-stop layer 12 including a group of etching openings 13, for example, a second further group of openings 11 is created above trench 7 in grid structure 5 and potentially, in dielectric layer 8. In addition, dielectric layer 8 is at least partially removed from bottom regions 15 but not from wall regions 14 during the further etching step. This is possible especially by using a directional etching method in the further etching step, the directional etching method having no or only a slight isotropic etching rate.

Figure 5:
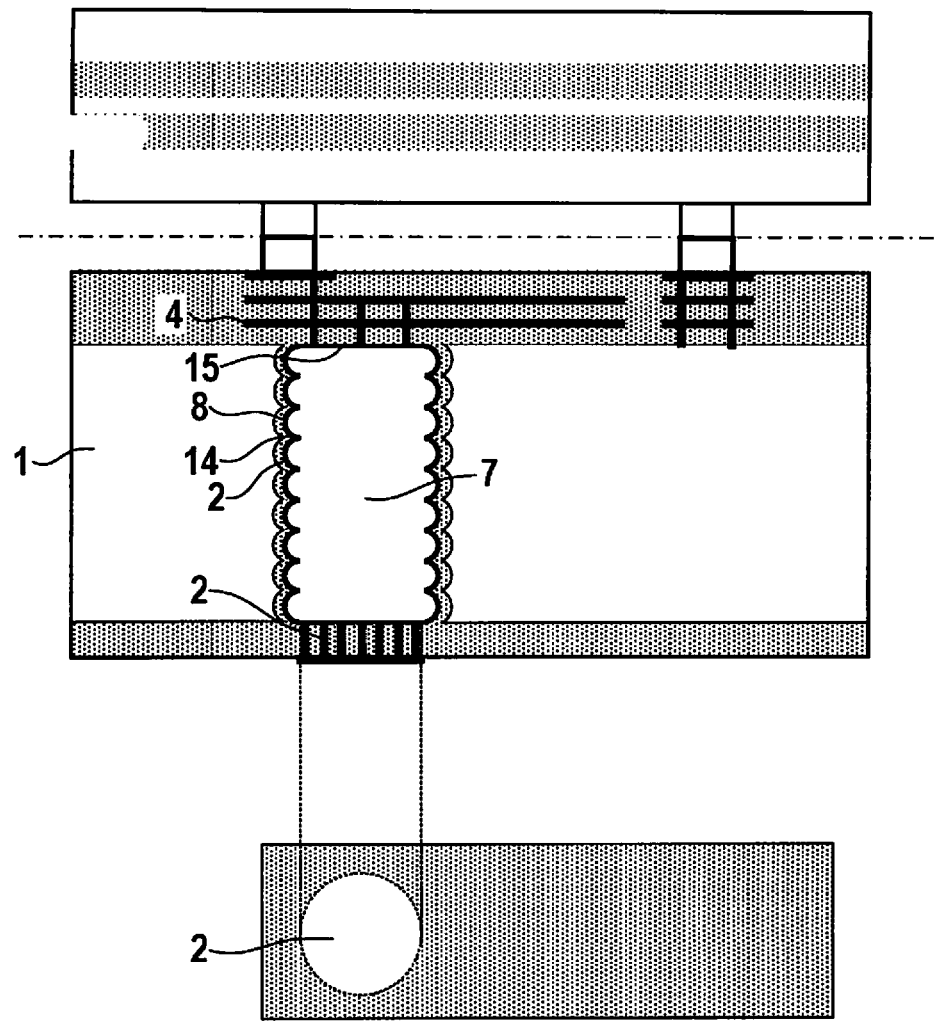
FIG. 5 schematically shows an example embodiment of the present invention following a fifth step.

In FIG. 5, an example embodiment of the present invention following a fifth step is schematically shown. In the fifth step, a metal component 2 is positioned in trench 7, at least partially in the area of wall regions 15 on dielectric layer 8 and at least partially on bottom regions 15. In the fifth step, the second further group of openings 11 (and, if still present following the third step, also the group of openings 6) is packed at least with metal component 2 so that trench 7 is sealed or covered in the region of surface 19 at least through an interaction of metal component 2, grid structure 5, and potentially dielectric layer 8. This creates a sealed/closed cavity in the interior of trench 7.

Figure 6:
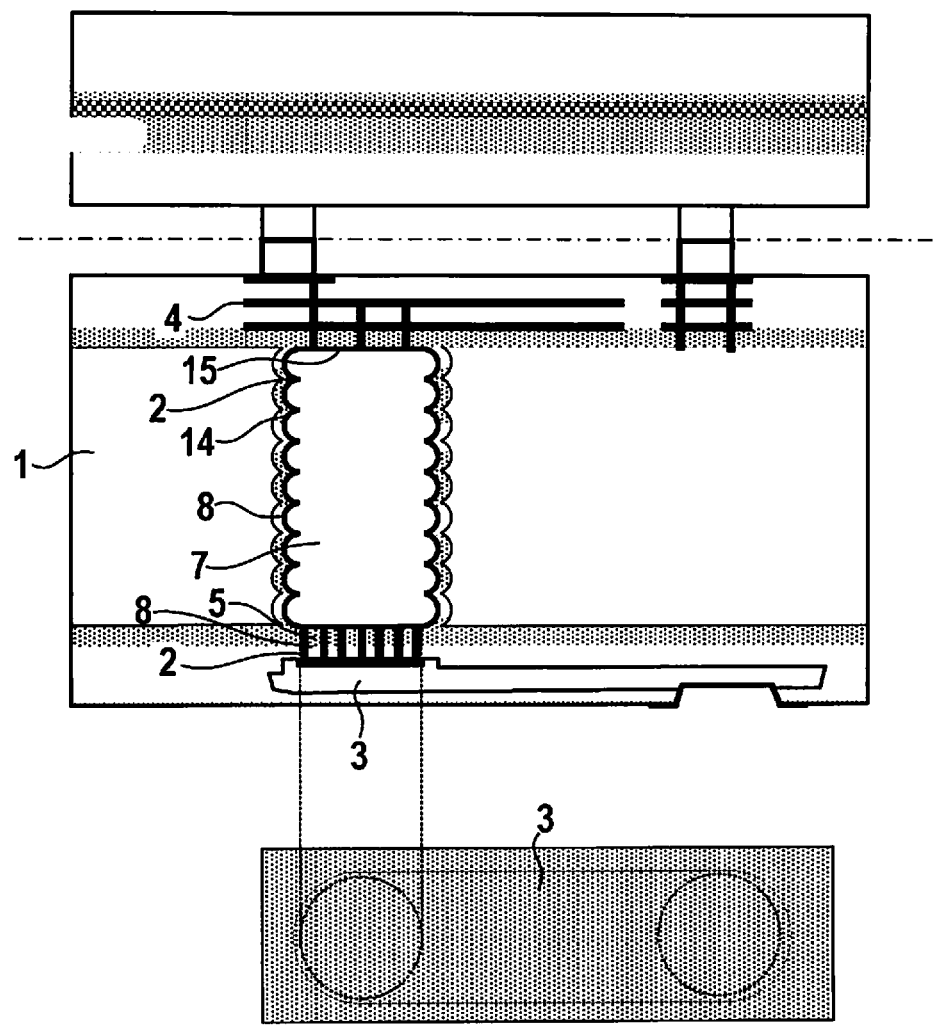
FIG. 6 schematically shows an example embodiment of the present invention following a fifth step and following the application of at least a portion of a first conductive structure.

In FIG. 6, an example embodiment of the present invention is schematically shown following a fifth step and following an application of at least a portion of a first conductive structure 3. This makes it possible to arrange first conductive structure 3 there following the fifth step. The metal component electrically connects first conductive structure 3 and second conductive structure 4 to each other. Subsequently, an electric contact to first (electrically) conductive structure 3 can additionally be established, for instance using a solder technique or bonding technique.

Figure 7:
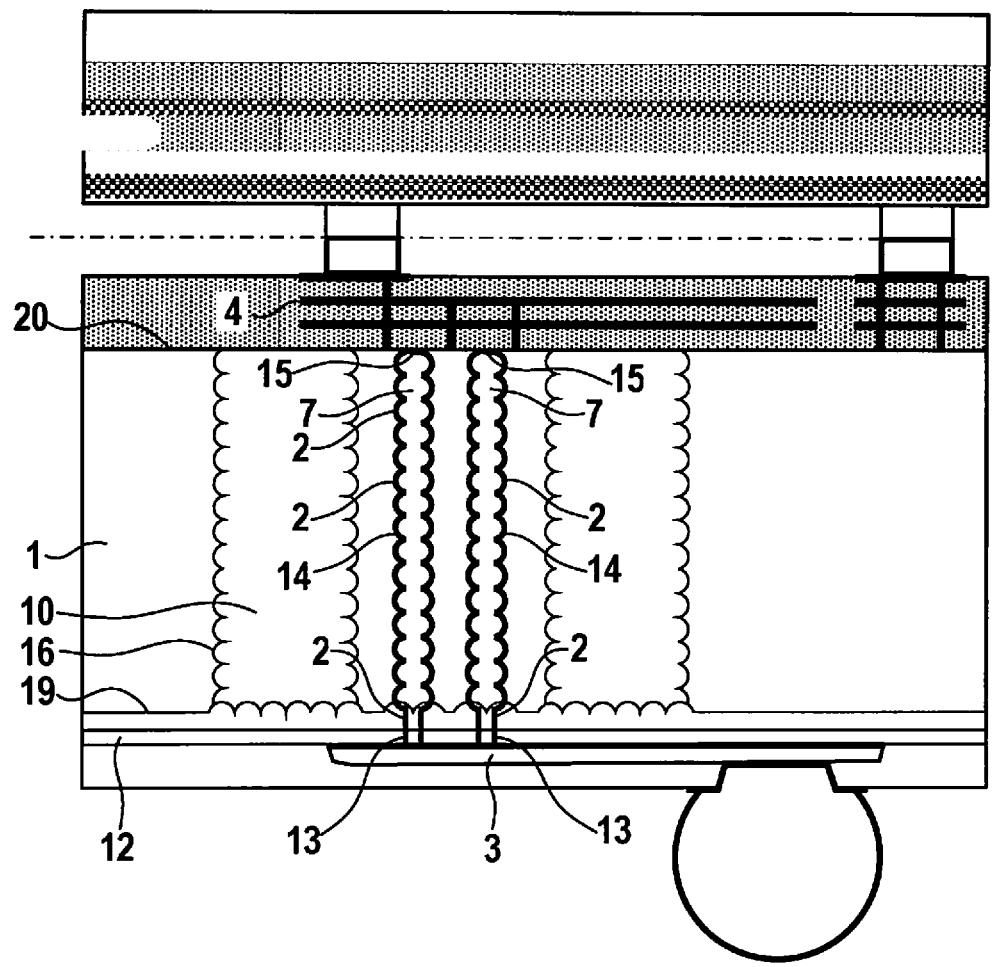
FIG. 7 schematically shows a conductive through-plating through a substrate according to a further example embodiment of the present invention.

FIG. 7 schematically shows a conductive through-plating through a substrate according to another example embodiment of the present invention. In this case, a plurality of trenches 7 is disposed in a substrate 1 so that trenches 7 extend from surface 19 (or from the environment of surface 19) to a further surface 20 (or to the environment of further surface 20). A first conductive structure 3 is developed on surface 19 of substrate 1 (or in the environment of surface 19 of substrate 1). A second conductive structure 4 is developed on further surface 20 of substrate 1 (or in the environment of further surface 20 of substrate 1). Trenches 7 have wall regions 14 and bottom regions 15, bottom regions 15 being situated in the environment of further surface 20 and wall regions 14 representing the boundary of trenches 7 with respect to surrounding substrate 1. A metal component 2 is situated (or at least partially situated) in trenches 7, in particular in the area of wall regions 14 and bottom regions 15. The metal component electrically connects first conductive structure 3 and second conductive structure 4 to each other. A grid structure 5 is situated above trenches 7 (in the environment of topside 19) in a layer, the dielectric layer 8 in particular being at least partially developed on grid structure 5.

Dielectric layer 8 and grid structure 5 preferably include identical material components. Above trenches 7, openings (in particular a group of openings 6 and/or a further, second group of openings 11) are present in dielectric layer 8 and grid structure 5. The openings (i.e., in particular the group of openings 6 and/or the second, further group of openings 11) are packed at least with metal component 2, so that trenches 7 are sealed or covered in the region of surface 19 at least through an interaction of metal component 2, grid structure 5 and potentially, dielectric layer 8. A sealed cavity is thereby provided in the interior of trenches 7 in each case. An etch-stop layer 12 including a group of etch openings 13 is disposed above dielectric layer 8 or above grid structure 5 (and in particular at least partially underneath first conductive structure 3). The group of etch openings 13 is at least partially situated above the group of openings 6 and/or the second, further group of openings 11. The group of etch openings 13, as well, is preferably packed with metal component 2. A further trench 10 is developed around trenches 7 in the form of a ring. Further trench 10 extends from the surface of substrate 1 to further surface 20 of substrate 1, in particular so that further trench 10 is developed across the entire thickness of substrate 1 (or approximately across the entire thickness of substrate 1). Further trench 10 has further wall regions 16 and further bottom regions 17. Further trench 10 is covered or sealed by an additional dielectric layer (which is electrically insulating, in particular) in the region of further surface 20 of substrate 1. In the region of the surface, further trench 10 is covered or sealed by grid structure 5 and/or by dielectric layer 8. A cavity is thereby developed inside further trench 10. Further trench 10 thus electrically insulates the portion of substrate 1 that it surrounds/encloses (including trenches 7) from the rest of substrate 1.

Figure 8:
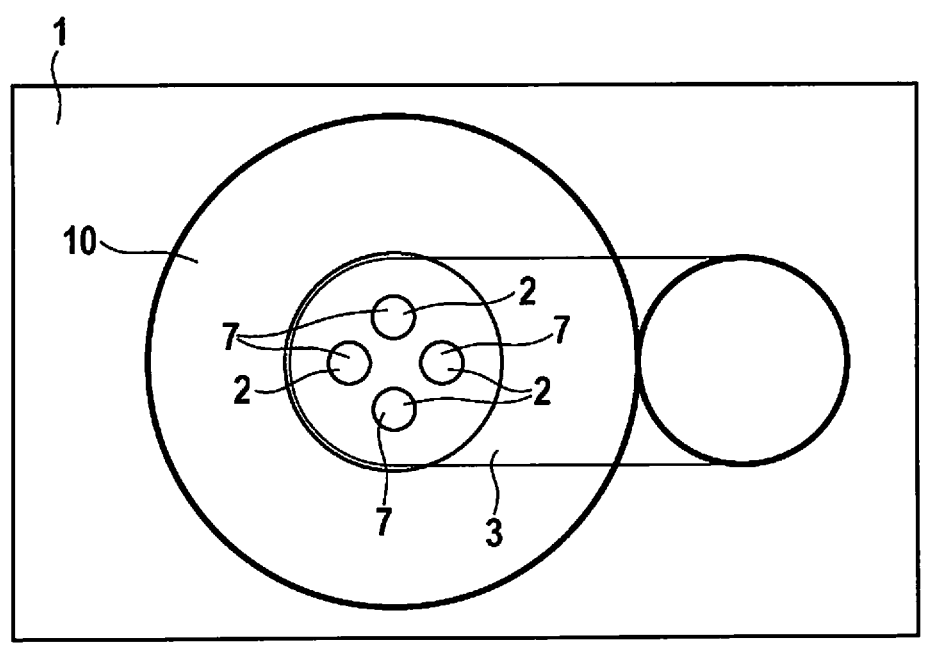
FIG. 8 schematically shows a conductive through-plating through a substrate according to a further example embodiment of the present invention.

FIG. 8 schematically shows a conductive through-plating through a substrate according to a further example embodiment of the present invention. More specifically, it shows a plan view of surface 19 of substrate 1. In this further example embodiment, there are four trenches 7, each being sealed using a metal component 2 in the region of surface 19. A further trench 10 is developed in the form of a ring around four trenches 7. Further trench 10 extends from surface 19 of substrate 1 to further surface 20 of substrate 1, in particular in such a way that further trench 10 is developed across the entire thickness of substrate 1 (or approximately across the entire thickness of substrate 1). Further trench 10 thus electrically insulates the portion of substrate 1 that it surrounds/encloses (including trenches 7) from the rest of the substrate. To be seen in electrical contact with metal component 2 is a first conductive structure 3 in the region of surface 19 of substrate 1.

Figure 9:
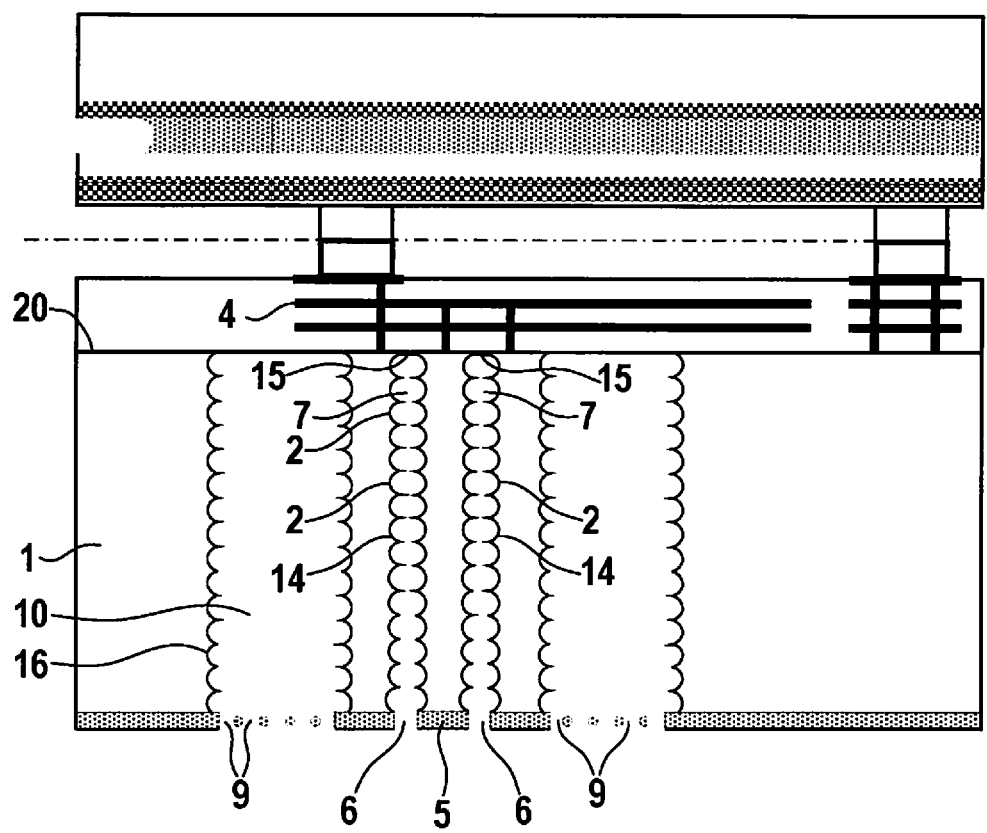
FIG. 9 schematically shows a further example embodiment of the present invention following a second step.

FIG. 9 schematically shows a further example embodiment of the present invention following a second step. After a grid structure 5 has been produced in a first step in a layer situated on surface 19, trenches 7 are produced or created in a substrate 1 in a second step, so that trenches 7 extend from surface 19 (or from the environment of surface 19) to a further surface 20 (or to the environment of further surface 20). A second conductive structure 4 is developed on further surface 20 of substrate 1 (or in the environment of further surface 20 of substrate 1). Trenches 7 include wall regions 14 and bottom regions 15, bottom regions 15 in particular being situated in the environment of further surface 20 and wall regions 14 representing the boundary of the trench with respect to surrounding substrate 1. A grid structure 5 is situated above trenches 7 (in the environment of topside 19). A group of openings 6 is provided in grid structure 5. The group of openings 6 is at least partially situated above trenches 7. A further trench 10 is developed around trenches 7.

Further trench 10 extends from the surface of substrate 1 to further surface 20 of substrate 1, in particular in such a way that further trench 10 is developed across the entire thickness of substrate 1 (or approximately across the entire thickness of substrate 1). Further trench 10 thus electrically insulates the portion of substrate 1 that it encloses (including trenches 7) from the rest of substrate 1. Further trench 10 has further wall regions 16 and further bottom regions 17. In the area of further surface 20 of substrate 1, further trench 10 is covered or sealed by an additional dielectric layer (which is electrically insulating, in particular). A grid structure 5 is disposed in the region of the surface above further trench 10. Grid structure 5 includes a further group of openings 9 at least partially above trench 10. Using the further group of openings 9, further trench 10 is etched into substrate 1 in the second step.

Figure 10:
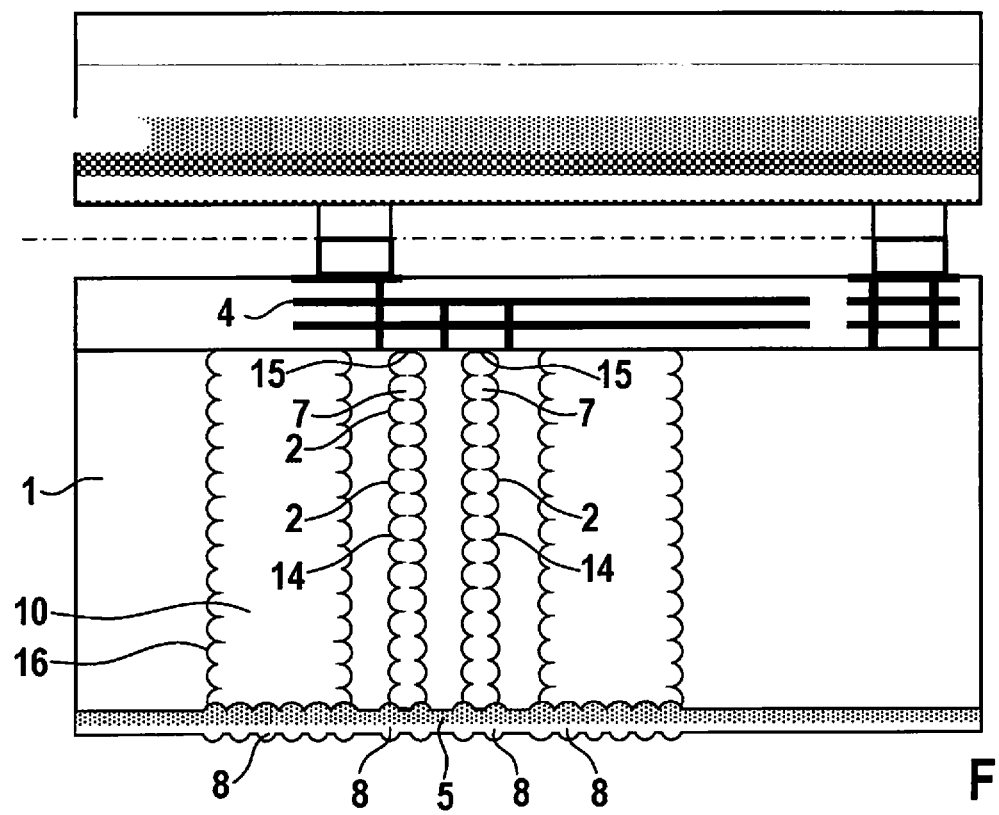
FIG. 10 schematically shows a further example embodiment of the present invention following a third step.

FIG. 10 schematically shows a further example embodiment of the present invention following a third step. In the third step, which follows the second step, a dielectric layer 8 is at least partially positioned on grid structure 5. In the further example embodiment illustrated in FIG. 10, dielectric layer 8 covers both the group of openings 6 and the further group of openings 9 following the third step. Dielectric layer 8 has electrically insulating properties.

Figure 11:
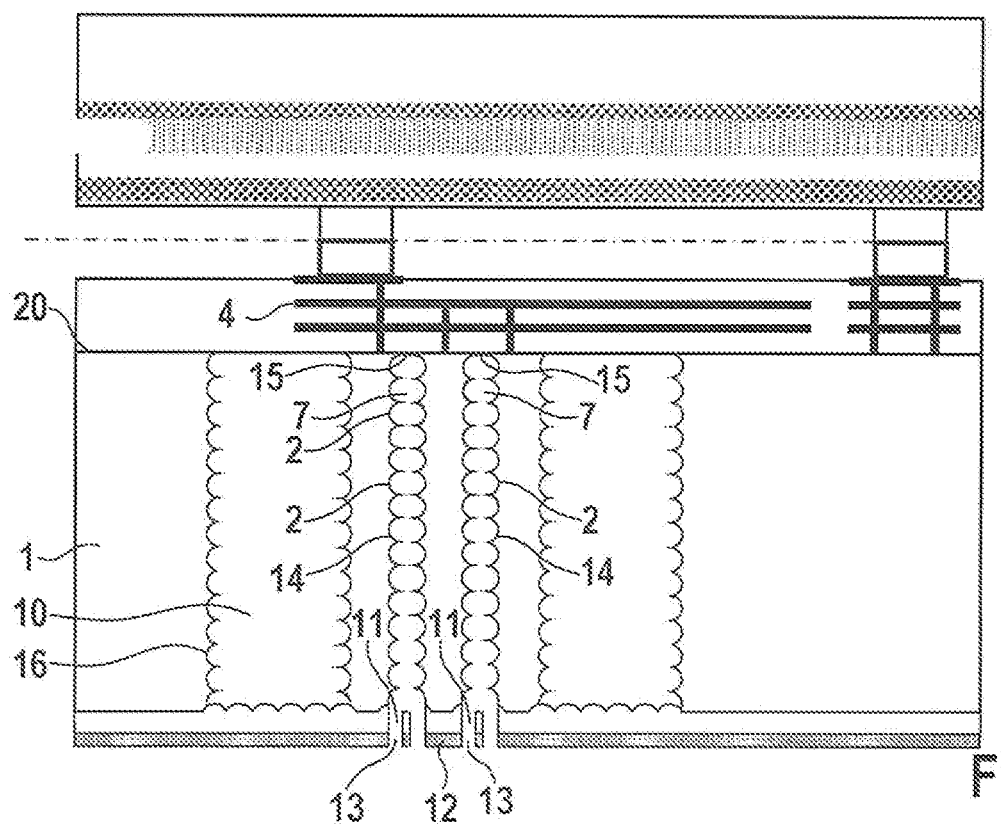
FIG. 11 schematically shows a further example embodiment of the present invention following a fourth step.

FIG. 11 schematically shows a further example embodiment of the present invention following a fourth step. In the fourth step, an etch-stop layer 12 is deposited and a further etching step is carried out. Using a mask and/or an etch-stop layer 12, for example, a second, further group of openings 11 is created above trenches 7 in grid structure 5 and potentially, in dielectric layer 8.

Figure 12:
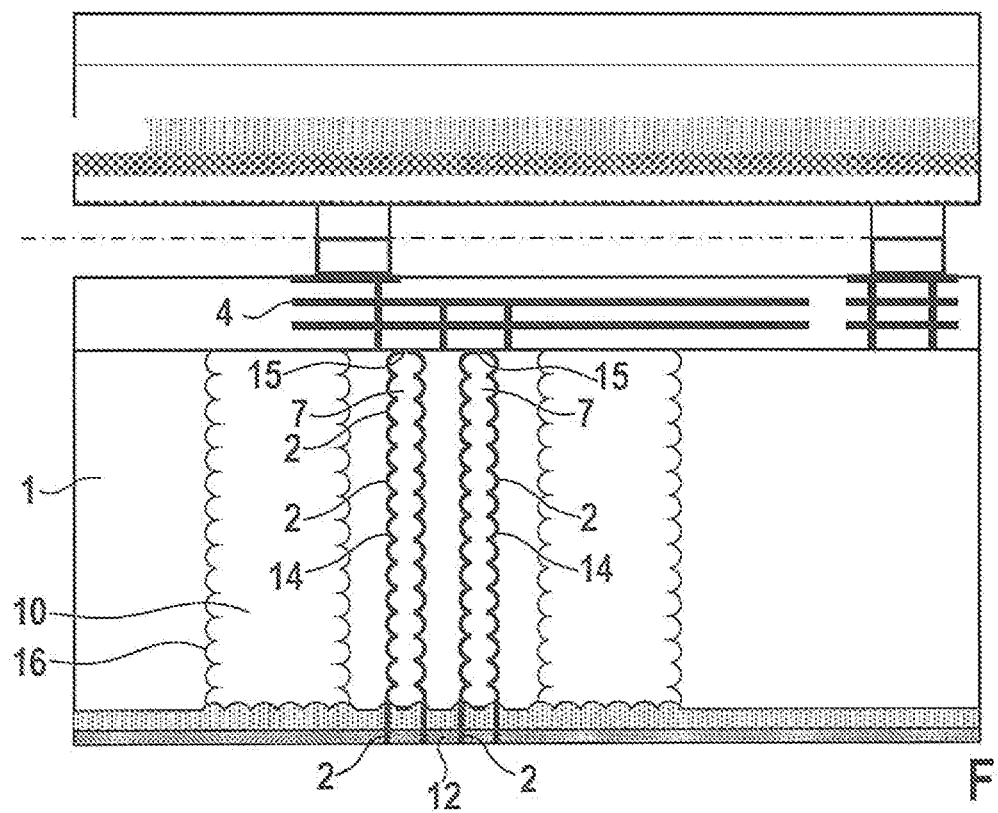
FIG. 12 schematically shows a further example embodiment of the present invention following a fifth step.

FIG. 12 schematically shows a further example embodiment of the present invention following a fifth step. In the fifth step, a metal component 2 is positioned in trenches 7, at least partially on wall regions 14 and at least partially on bottom regions 15. Second, further group of openings 11 (and, if still present following the third step, also the group of openings 6) is packed with metal component 2 in the fifth step at least so that trenches 7 are sealed or covered in the region of surface 19 at least through an interplay of metal component 2, grid structure 5, and potentially dielectric layer 8 in each case. A sealed cavity is thereby preferably produced in the interior of trenches 7. Since dielectric layer 8 and grid structure 5 and preferably etch-stop layer 12 completely cover further trench 10 in the region of surface 19, metal component 2 is not disposed in the interior of further trench 10.

What is claimed is:

1. A method for producing a conductive through-plating for a substrate, the through-plating including a metal component, a first conductive structure situated on or in an environment of a first surface of the substrate, and a second conductive structure situated on or in the environment of a second surface of the substrate, the method comprising:
   in a first step, at least partially situating, in a grid structure region above the first surface, a grid structure that includes a first group of openings;
   in a second step subsequent to the first step, carrying out a first etching that produces in the substrate a first trench that is at least partially underneath the first group of openings of the grid structure region;
   in a third step subsequent to the second step, carrying out a metallization that at least partially positions the metal component in the first trench and that develops the metal component such that the metal component is part of a seal that seals the first trench in a region of the first surface; and
   prior to the third step, filling the first group of openings and then forming a plurality of new openings in the grid structure region above the first trench.

2. The method of claim 1, further comprising forming a grid structure includes a second group of openings outside the grid structure region, the openings of the second group of openings having a similar or smaller opening width and opening length compared to the openings of the first group of openings, wherein a second trench is produced in the substrate and at least partially underneath the second group of openings during the first etching of the second step.

3. The method of claim 2, wherein:
   the dielectric layer is positioned in a fourth step, following the second step and prior to the third step, with at least a part of the dielectric layer completely covers the second group of openings; and in the third step, all surfaces of the second trench remain free of the metal component.

4. The method of claim 2, wherein the second trench is at least partially an annular region at least around the first trench.

5. The method of claim 1, wherein the filling of the first group of openings includes depositing of a dielectric layer, and the forming of the new openings includes removing part of the deposited dielectric layer.

6. The method of claim 5, wherein at least a portion of the deposited dielectric layer is deposited on a sidewall of the first trench and at least a portion of the metal component is positioned in the first trench within the at least the portion of the deposited dielectric layer.

7. The method of claim 5, wherein a portion of the deposited dielectric layer is deposited on a sidewall of the first trench, a portion of the metal component is positioned in the first trench within the at least the portion of the deposited dielectric layer, and another portion of the metal component fills the new openings.

8. The method of claim 5, wherein the depositing of the dielectric layer and the removal of the part of the deposited dielectric layer is performed in a fourth step that follows the second step.

9. The method of claim 8, wherein, during and following the depositing of the dielectric layer, the first group of openings is at least partially free of the dielectric layer.

10. The method of claim 8, wherein, in the fourth step, the dielectric layer (a) is at least partially situated on a sidewall of the first trench and (b) at a region of the first trench that is at the second surface of the substrate, extends essentially perpendicularly to the sidewall of the first trench.

11. The method of claim 10, further comprising forming a grid structure that includes a second group of openings outside of the grid structure region, the openings of the second group of openings having a similar or smaller opening width and opening length compared to the openings of the first group of openings;
wherein:
a second trench is produced in the substrate and at least partially underneath the second group of openings during the first etching of the second step;
in the third step, the metal component is at least partially situated on the sidewall and extends essentially perpendicularly to the sidewall in the region of the first trench that is at the second surface of the substrate; and
in the third step, all surfaces of the second trench remain free of the metal component.

12. The method of claim 8, further comprising forming a grid structure that includes a second group of openings outside of the grid structure region, the openings of the second group of openings having a similar or smaller opening width and opening length compared to the openings of the first group of openings;
wherein:
a second trench is produced in the substrate and at least partially underneath the second group of openings during the first etching of the second step;
the removal of the part of the deposited dielectric layer is performed by carrying out a second etching during which the new openings are created in the dielectric layer the new openings being at least partially situated above the first trench;
following the third step, the metal component is situated in such a way that the metal component seals the new openings; and
during the fourth step, the second group of openings is completely covered by the dielectric layer.

13. The method of claim 12, wherein:
in the fourth step, the dielectric layer (a) is at least partially situated in the first trench on a sidewall of the first trench and (b) at a region of the first trench that is at the second surface of the substrate, extends essentially perpendicularly to the sidewall of the first trench; and
during the second etching, the dielectric layer is at least partially removed from the region region of the first trench that is at the second surface of the substrate.

14. The method of claim 12, wherein:
in the fourth step, the dielectric layer (a) is at least partially situated on a sidewall of the first trench and (b) at a region of the first trench that is at the second surface of the substrate, extends essentially perpendicularly to the sidewall of the first trench; and
the removal of the part of the dielectric layer includes at least partially removing the dielectric layer from the sidewall of the first trench.

15. The method of claim 12, wherein, prior to the removal of the part of the deposited dielectric layer, an etch-stop layer is at least partially deposited on at least one of the first surface of the substrate and the dielectric layer, the etch-stop layer having a group of etch openings at least partially situated above the new openings.

16. A conductive through-plating for a substrate, the through-plating comprising:
a first conductive structure situated on or in an environment of a first surface of the substrate;
a second conductive structure situated on or in an environment of a second surface of the substrate;
a grid structure;
a first trench situated in the substrate between the first and second surfaces and at least partially underneath the grid structure;
a dielectric layer that coats a sidewall of the first trench and extends into the grid structure; and
a metal component that (a) is partly disposed in the first trench within a portion of the dielectric layer that coats the sidewall of the first trench, (b) extends into the grid structure so that the grid structure, in a region above the first trench, is formed of a plurality of parts of the dielectric layer interspersed among a plurality of parts of the metal component, and (c) is part of a seal sealing the first trench in a region of the first surface.

* * * * *